(12) United States Patent
Liobe et al.

(10) Patent No.: US 10,516,843 B2
(45) Date of Patent: Dec. 24, 2019

(54) PIXEL ARRAY WITH INTERNAL COARSE DIGITIZATION

(71) Applicant: Sensors Unlimited, Inc., Princeton, NJ (US)

(72) Inventors: John Liobe, New York, NY (US); Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 15/895,632

(22) Filed: Feb. 13, 2018

(65) Prior Publication Data
US 2019/0253656 A1   Aug. 15, 2019

(51) Int. Cl.
| H04N 5/374 | (2011.01) |
| H04N 5/3745 | (2011.01) |
| H03M 1/12 | (2006.01) |
| H04N 5/378 | (2011.01) |
| H03H 7/06 | (2006.01) |

(52) U.S. Cl.
CPC .......... H04N 5/37455 (2013.01); H03M 1/12 (2013.01); H03H 7/06 (2013.01); H04N 5/378 (2013.01)

(58) Field of Classification Search
None
See application file for complete search history.

(56) References Cited

U.S. PATENT DOCUMENTS

| 4,771,267 | A | * | 9/1988 | Russell, Jr. | ............ | C09K 3/185 |
| | | | | | | 341/118 |
| 5,357,331 | A | | 10/1994 | Flockencier | | |
| 6,384,413 | B1 | * | 5/2002 | Pain | ........................ | G01J 1/46 |
| | | | | | | 250/330 |
| 7,333,040 | B1 | | 2/2008 | Dierickx et al. | | |
| 9,698,182 | B2 | | 7/2017 | Lin et al. | | |
| 2014/0320716 | A1 | * | 10/2014 | Huang | .................. | H04N 5/378 |
| | | | | | | 348/302 |
| 2015/0009337 | A1 | * | 1/2015 | Minlong | ................. | H04N 5/33 |
| | | | | | | 348/166 |
| 2016/0268331 | A1 | * | 9/2016 | Parmesan | ......... | H01L 27/14641 |
| 2016/0285444 | A1 | * | 9/2016 | Denham | ................. | H03K 7/06 |
| 2016/0293647 | A1 | | 10/2016 | Lin et al. | | |
| 2018/0041727 | A1 | | 2/2018 | Lund et al. | | |
| 2018/0376082 | A1 | * | 12/2018 | Liu | ....................... | G01J 1/4228 |

OTHER PUBLICATIONS

Shahbaz Abbasi, S., et al., "A PFM-Based Digital Pixel With an Off-Pixel Residue Measurement for Small Pitch FPAs", IEEE Transactions on Circuits and Systems—II: express Briefs, vol. 64, No. 8, pp. 887-891, Aug. 2017.

Proesel, J.A. and Pileggi, L.T. "A 0.6-to-1V Inverter-Based 5-bit Flash ADC in 90nm Digital CMOS", IEEE Custom Integrated Circuits Conference (CICC), 978-1-4244, MP-01-1, pp. 153-156, 2008.

\* cited by examiner

*Primary Examiner* — James M Hannett
(74) *Attorney, Agent, or Firm* — Locke Lord LLP; Scott D. Wofsy; Judy R. Naamat

(57) ABSTRACT

A pixel of a pixel array is provided. The pixel includes a low frequency path configured to receive an input signal from a corresponding photodetector. The low frequency path includes a passive imaging circuit provided along the low frequency path, the passive imaging circuit configured to output an analog imaging signal and a flash analog to digital converter (ADC) that receives the analog imaging signal and processes the analog imaging signal to output a coarse digitized signal.

20 Claims, 8 Drawing Sheets

PIXEL ARRAY WITH INTERNAL COARSE DIGITIZATION

BACKGROUND OF THE DISCLOSURE

1. Field of the Invention

The present disclosure relates to a pixel array of a focal plane array having passive imaging or multimode pixels, and more particularly to a pixel array having internal coarse digitization.

2. Description of Related Art

An infrared (IR) focal-plane array (FPA) (e.g., a short-wave infrared (SWIR), mid-wave infrared (MWIR), long-wave infrared (LWIR), near-infrared (NIR) FPA) includes an array of pixels (referred to as the pixel array) each receiving input from an IR-sensitive sensing device (referred to as a photodetector) and a digitization circuit. The individual pixels include a low frequency path that includes a passive imaging circuit. The passive imaging circuit receives an input signal from the corresponding photodetector and converts it to an analog voltage signal. An input signal passing through the low frequency path may pass through several components that can include, for example one or more, buffers, filters, and/or amplifiers, and then provided to the digitization circuit to be digitized. Each component that operates on the input signal can introduce noise.

The digitization circuit can be provided in the FPA, in a location outside of the pixels. The digitization circuit can include an array of individual digitization circuits that correspond to each respective pixel. Each individual digitization circuit receives the analog signal output from the corresponding pixel and converts the analog signal into a digital signal.

In the case of a multimode pixel, the pixel can also include a high frequency path that includes an active imaging circuit for detecting laser pulses. The operation of the active imaging circuit can depend upon ambient illumination conditions and a sensitivity setting of the active imaging circuit. For example, when the FPA is exposed to bright ambient illumination conditions, the active imaging circuit operation is improved by using a high sensitivity setting to increase the sensitivity of the active imaging circuit. Conversely, when the FPA is exposed to dark ambient illumination conditions, the active imaging circuit operation is improved by using a low sensitivity setting to decrease sensitivity of the active imaging circuit. The sensitivity of the active imaging circuits of the entire pixel array can be controlled together (i.e., in a global fashion). However, photodetectors corresponding to different pixels of the pixel array can be exposed to different amounts of ambient illumination. Accordingly, a sensitivity setting for the entire pixel array may not be ideal for a good portion of the pixels.

While conventional methods and systems have generally been considered satisfactory for their intended purpose, there is still a need in the art for digitizing the input signal received in a pixel from the corresponding photodetector as close as possible to the location in the pixel at which the input signal is received. Additionally, there is still a need in the art for independently adjusting sensitivity of active imaging circuits associated with individual pixels or subarrays of a pixel array in response to ambient illumination conditions to which the corresponding photodetector is exposed. The present disclosure provides a solution for this.

SUMMARY

In accordance with an aspect of the disclosure, a pixel of a pixel array is provided. The pixel includes a low frequency path configured to receive an input signal from a corresponding photodetector. The low frequency path includes a passive imaging circuit provided along the low frequency path, the passive imaging circuit configured to output an analog imaging signal and a flash analog to digital converter (ADC) that receives the analog imaging signal and processes the analog imaging signal to output a coarse digitized signal.

In embodiments, the analog imaging signal and the coarse digitized signal are both provided to a column conductor of the pixel array for being propagated outside of the pixel array.

In further embodiments, the pixel further includes a high frequency path configured to receive an input signal from a corresponding photodetector. The high frequency path includes an active imaging circuit receiving the coarse digitization signal as a sensitivity input that adjusts sensitivity of the active imaging circuit for sensing laser pulses and outputting a pulse signal that indicates whether a pulse was detected.

In embodiments, the analog imaging signal and the coarse digitized signal are both provided to a column conductor of the pixel array for being propagated outside of the pixel array.

In further embodiments, the active imaging circuit includes a high-pass filter, and the sensitivity input adjusts a frequency response of the high-pass filter.

In embodiments, the high-pass filter includes an RC filter that includes a plurality of resistive devices and at least one capacitive device, wherein at least one selected resistive device of the plurality resistive devices is connected to the RC filter, and the at least one selected resistive device is selected based on the sensitivity input.

In further embodiments, the active imaging circuit further includes a comparator coupled to at least one selected frequency response device of a plurality of frequency response devices. Each of the frequency response devices influences a frequency response of the comparator. The at least one selected frequency response device is selected based on the sensitivity input.

In embodiments, the at least one selected frequency response device is coupled to a single node, and the single node is coupled to the comparator.

In further embodiments, the active imaging circuit further includes a buffer to store the output from the comparator, wherein the buffer is provided to a column of a readout circuit of the pixel array.

In embodiments, the flash ADC includes a plurality of components of one common type. Each of the components operates on the analog imaging signal differently relative to the other components. Additionally, each of the components outputs a component signal, wherein the component signal is indicative of the associated component's operation on the analog imaging signal. The component signals output by the plurality of components are at least one of the coarse digitized signals or are encoded into the coarse digitized signal.

In embodiments, the components are inverters, wherein each inverter has a unique voltage transfer curve (VTC) that defines a threshold voltage that causes the inverter to operate on the analog imaging signal differently than the other inverters and to output an associated component signal as a HIGH or a LOW value.

In further embodiments, each of the inverters includes a PMOS transistor having a first dimension characteristic DCP and an NMOS transistor having a second dimension characteristic DCN, wherein each of the first and second dimension characteristics are defined by at least one dimension of the corresponding NMOS or PMOS transistor, a unique ratio DCP/DCN is associated with each inverter, and the ratio DCP/DCN associated with each transistor influences the VTC associated with the inverter.

In embodiments, each component of the plurality of components is a comparator associated with a unique node of multiple nodes of a resistor chain. The resistor chain includes a plurality of resistors coupled in series to a reference voltage, wherein each of the nodes of the resistor chain is positioned between different resistors of the resistor chain and has a unique voltage relative to the other nodes. Each comparator receives the analog imaging signal as an input voltage, and is further coupled to its associated node to receive a reference input voltage. A signal output by the comparator is the corresponding component signal.

In embodiments, the components are configured so that the component signals are provided as a thermometer code.

In embodiments, the pixel further comprises an encoder, wherein the encoder encodes the component signals output by the plurality of components and outputs the coarse digitized signal.

In accordance with further aspects of the disclosure, a focal plane array (FPA) is provided. The FPA includes an array of pixels and a plurality of flash ADCs. Each pixel of the array includes a low frequency path configured to receive an input signal from a corresponding photodetector, the low frequency path including a passive imaging circuit configured to output an analog imaging signal. Each flash ADC corresponds to a different individual pixel of the array of pixels or a different subarray of pixels of one or more subarrays of the pixel array. The flash ADC is configured to receive the analog imaging signal output by at least one of the pixels to which it corresponds, and processes the analog imaging signal to output a coarse digitized signal.

In embodiments, the FPA can further include a column conductor coupled to the passive imaging circuits and the flash ADCs of the pixel array for receiving the analog imaging signal and the coarse digitized signal and an external ADC coupled to a portion of the column conductor that is external to the array of pixels. This external ADC can be co-located on the same die as the pixel array. The external ADC converts the analog imaging signal into a fine component and outputs a full digitized signal that includes the coarse component and the fine component.

In further embodiments, the external ADC generates a fine component using the analog imaging signal and outputs a full digitized signal that uses the fine component. The external ADC further applies redundancy processing to the coarse digitized component for incorporating the coarse digitized signal into the full digitized signal.

In embodiments, a subarray of the at least one subarrays includes a subset of pixels of the array of pixels and a digital coarse bus connected to the flash ADC that corresponds to the subarray. The digital coarse bus is configured to receive a coarse digitized signal output by the flash ADC and to provide the coarse digitized signal received to an active imaging circuit in each of the subset of pixels of the subarray as a sensitivity input for adjusting the sensitivity of each of the active imaging circuits of the respective pixels of the subset of pixels.

In further embodiments, the subarray includes a conductor for coupling a passive imaging circuit of at least two pixels of the subset of pixels of the subarray to the flash ADC to provide analog imaging signals to the flash ADC. A pixel of the at least two pixels is selected to provide the analog imaging signals output by its passive imaging circuit to the flash ADC to be processed for outputting the coarse digitized signal.

In still a further aspect of the disclosure, a method is provided. The method includes receiving an input signal in a pixel from a corresponding photodetector, processing, in the pixel, low frequency components of the input signal using passive imaging processing to generate an analog imaging signal, and converting, in the pixel, the analog imaging signal into a coarse digitized signal.

In embodiments, the method further includes detecting, in the pixel, pulses included in high frequency components of the input signal, and adjusting sensitivity of the active imaging circuit using the coarse digitized signal.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
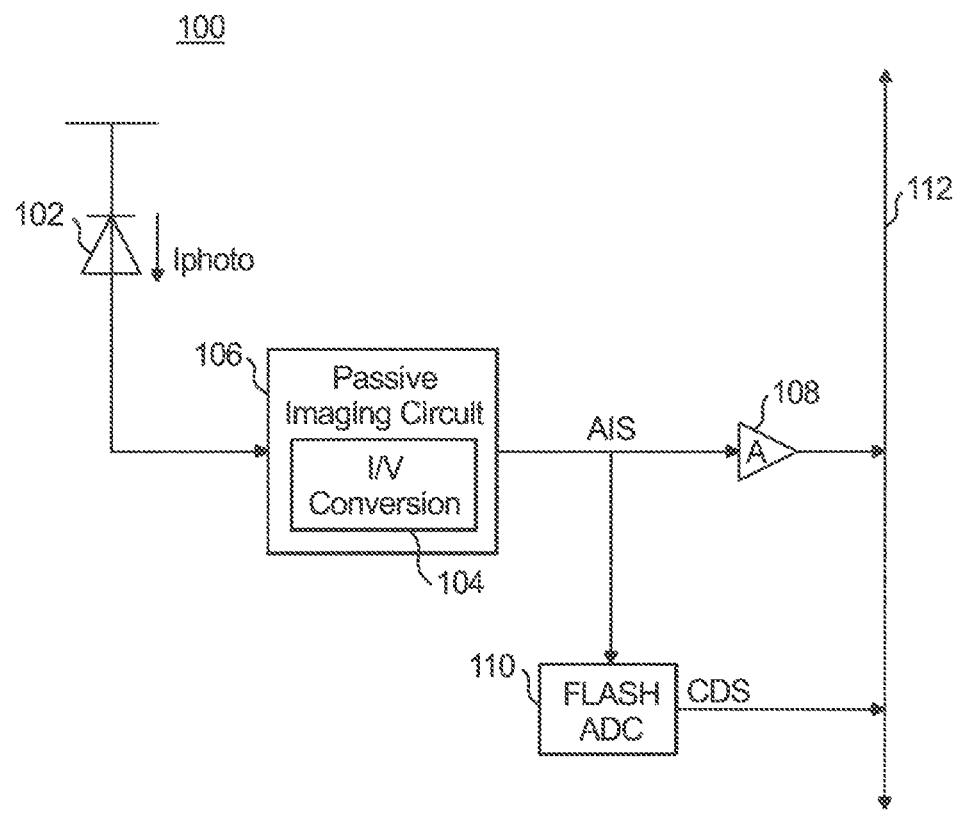
FIG. 1 shows a schematic diagram of an exemplary embodiment of a pixel having a passive imaging circuit and a flash analog-digital-converter (ADC) in accordance with embodiments of the present disclosure.

Reference will now be made to the drawings wherein like reference numerals identify similar structural features or aspects of the subject disclosure. For purposes of explanation and illustration, and not limitation, a schematic diagram of an exemplary embodiment of a pixel for passive imaging in accordance with the disclosure is shown in FIG. 1 and is designated generally by reference character 100. Other embodiments of a pixel in accordance with the disclosure, or aspects thereof, are provided in FIGS. 2-7D, as will be described.

Figure 2:
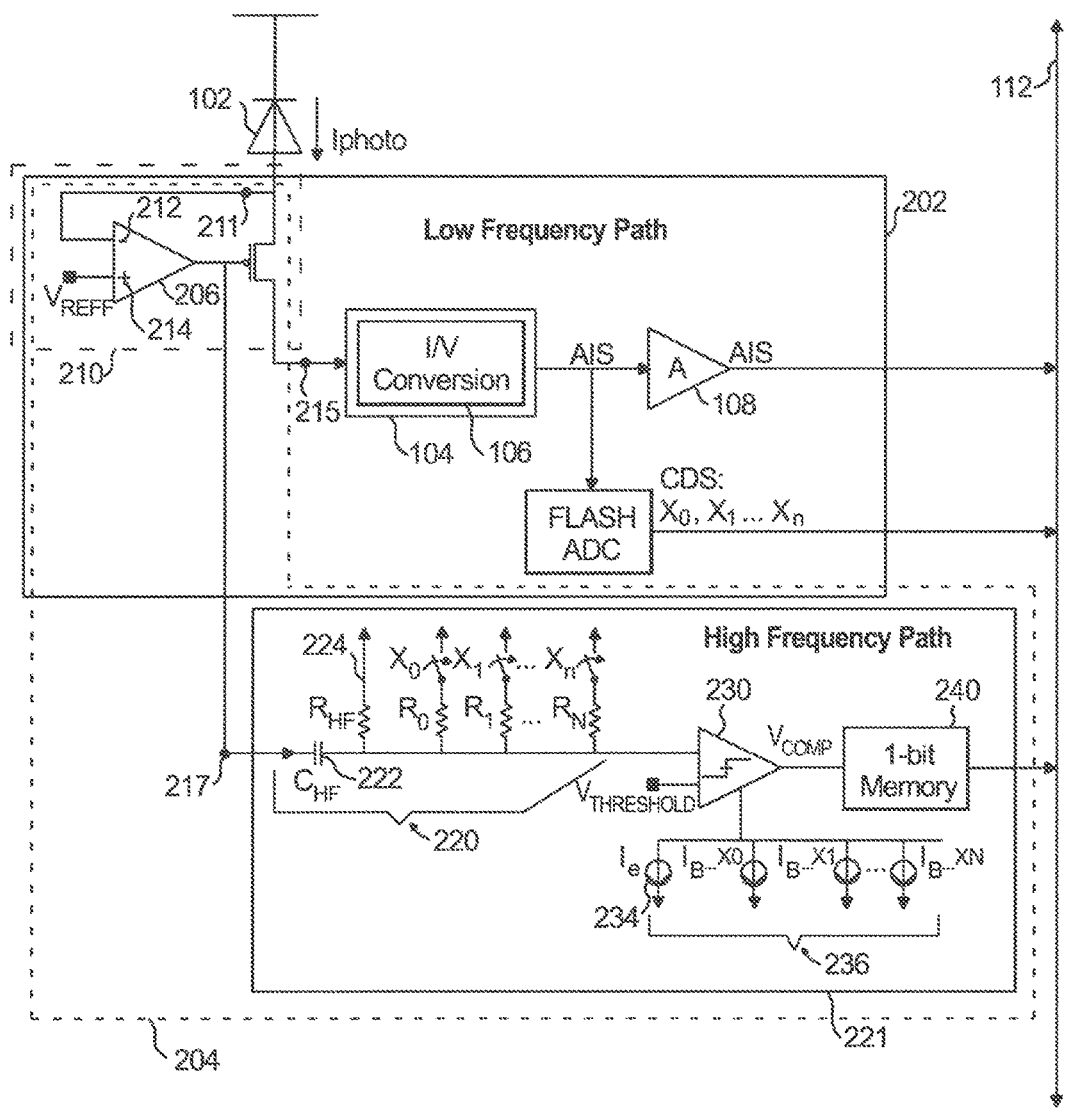
FIG. 2 shows a schematic diagram of another exemplary embodiment of a pixel having a passive imaging circuit, an active imaging circuit, and a flash analog-digital-converter (ADC) in accordance with embodiments of the present disclosure.
Figure 3:
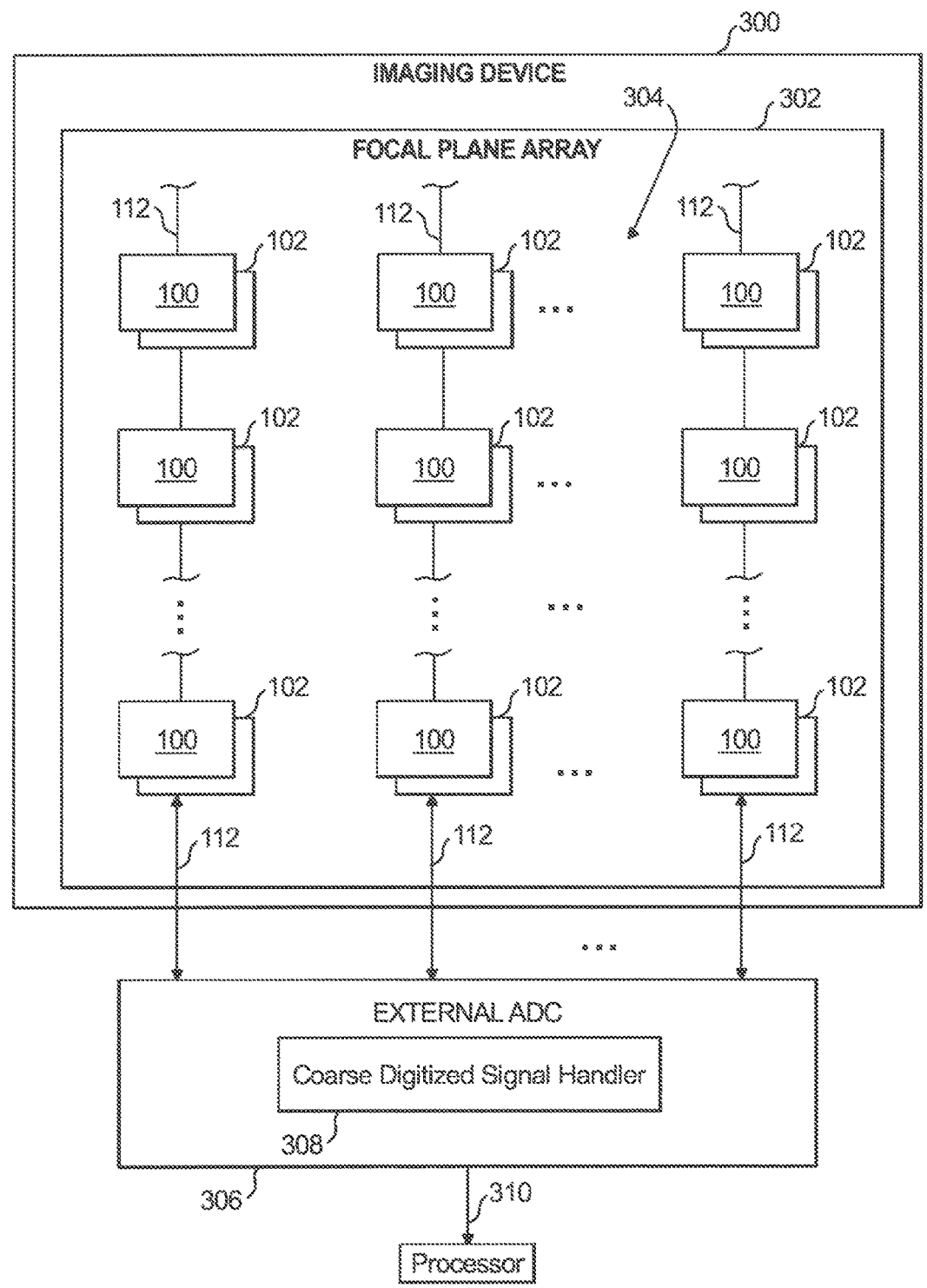
FIG. 3 shows a schematic diagram of an exemplary imaging device having an FPA with a pixel array in accordance with embodiments of the present disclosure.

The pixel 100 receives an input signal (iphoto) from a corresponding photodetector 102 of an array of photodetectors (see FIG. 3). The input signal is provided to a passive imaging circuit 104 that operates on low frequency (LF) signals and converts the input signal into an analog imaging signal (AIS). The passive imaging circuit 104 can include a current-to-voltage (I/V) converter 106 that converts charge in the input signal into the analog imaging signal. Pixel 100 can include only the components shown in FIG. 1 or can include additional components, such as the embodiment shown in FIG. 2.

The photodetector 102 can be an infrared (IR)-sensitive sensing device that outputs a charge, photocurrent, or resistance in response to excitation by photons in IR wavelengths. The photodetector 102 can operate in different regions of IR wavelengths, including, without limitation, shortwave infrared (SWIR), mid-wave infrared (MWIR), long-wave infrared (LWIR), and near-infrared (NIR). The infrared-sensitive materials can include, for example, mercury cadmium telluride (HgCdTe, "MerCad", or "MerCad-Tel"), indium antimonide (InSb, pronounced "Inns-Bee"), indium gallium arsenide (InGaAs), and vanadium (V) oxide (VOx). Alternatively, photodetector element 102 could represent any type of detector that generates charge, current, or resistance in response to ultraviolet, visible, or midwave illumination or other received electromagnetic signals, such as x-rays.

The magnitude of the photodetector output is proportional to the number of photons detected by the photodetector. The I/V converter 106 of the passive imaging circuit 104 can integrate the output of the photodetector 102, wherein the integration result is output as the analog imaging signal. The I/V convertor 106 can include an integration circuit, which can be any circuit that integrates signal charge to generate an output voltage level. In its most basic implementation, the integration circuit can be a capacitor. Another example embodiment of the integration circuit can include a capacitor and a current mirror.

The analog imaging signal can be temporarily buffered in a column buffer 108 and then output from the pixel 100 to an external analog-digital-converter (ADC), which provides a digital signal output to a column conductor 112 via which the analog imaging signal is propagated outside of the pixel array. The column buffer 108 can be, for example, a buffer amplifier that amplifies and temporarily stores a voltage until it is readout, e.g., to the column conductor 112.

The analog imaging signal is further provided to a flash ADC 110 provided within pixel 100. The flash ADC 110 includes a plurality of components of one common type, such as a plurality of comparators coupled to a resistor string, or a plurality of inverters, as described in greater detail below. Each of the components uniquely operates on the analog imaging signal relative to the other components. Each of the components outputs a component signal that is indicative of the associated component's operation on the analog imaging signal. The component signals that are output by the plurality of components can be output as a coarse digitized signal (CDS) or can be encoded and output as the coarse digitized signal. The coarse digitized signal includes one or more digits that are set to "HIGH" or "LOW." Each digit is referred to as a coarse signal digit.

The coarse digitized signal can be output from the pixel 100 and/or used internally by other components in the pixel 100. The coarse digitized signal can be output to the column conductor 112, and thus output from the pixel 100, and can thus be further output from a pixel array in which the pixel 100 is included. The coarse digitized signal can be output for readout or for further processing. For example, the coarse digitized signal can be output as a coarse component of a readout signal, whereas an external ADC that is external to the pixel array digitizes the analog imaging signal to provide a fine component of the readout signal. The coarse component and fine component can be combined to provide a complete readout signal. For example, the coarse component can provide the most significant bits (MSBs) of the complete readout signal and the fine component can provide the least significant bits (LSBs) of the complete readout signal. Alternatively, the coarse digitized signal can be output to the external ADC, providing redundancy for the buffered analog imaging signal provided to the external ADC from the column buffer 108.

FIG. 2 shows an embodiment of an exemplary pixel 100 in which pixel 100 is configured as a multimode pixel capable of performing both passive imaging and pulse detection. Pixel 100 includes a low frequency path 202 and a high frequency path 204. Both the low frequency path 202 and the high frequency path 204 include an initial pixel circuit 201 for initial processing of the input signal received from the photodetector 102. In the example shown in FIG. 2, the initial pixel circuit 201 uses buffer direct injection (BDI) technology, however the disclosure is not limited to BDI or to a particular type of pixel technology. Other pixel technologies can be used, such as direct injection, capacitive charge transfer and integration amplifier (CTIA), buffer GMOD, and source-follower pixel technology, without limitation. The example initial pixel circuit 201 shown includes a BDI amplifier 206 and a BDI transistor 208. The initial pixel circuit 201 buffers and amplifies the input signal from the photodetector 102 and further directs low frequency components of the input signal to the passive imaging circuit 104 of the low frequency path 202, and directs the high frequency components of the input signal to an active imaging circuit 221 of the high frequency path 204. The active imaging circuit 221 can be a pulse detection circuit.

Operation of the pixel 100 using the example BDI technology is described with regards to directing low frequency and high frequency signals along different paths. The disclosure is not limited to this exemplary configuration or operation of the pixel 100. The disclosure encompasses pixel design that includes a passive imaging circuit 104 that is configured to operate on low frequency signals, and an active imaging circuit 221 that is configured to operate on high frequency signals.

During operation, in the example shown, high frequency signals gravitate to a node 217 coupled to an active imaging circuit 221 of the high frequency path 204, where pulses can be detected in the high frequency signals. Low frequency signals gravitate to node 215 that is coupled to the passive imaging circuit 104 of the low frequency path 202 where current integration can be performed to generate the analog imaging signals.

An example pixel having a high frequency path and a low frequency path is described in U.S. patent application Ser. No. 14/997,171 having U.S. Publication No. 2017/0207262, which is incorporated herein by reference in its entirety. The present disclosure is not limited to a particular configuration of formation of the high frequency and low frequency path. By way of example, the BDI amplifier 206, which is shown in the example embodiment as an operational amplifier, receives a charge signal output by the photodetector 102 at an input terminal 212. A first reference voltage $V_{REFF}$ is provided to a reference (positive) terminal 214 of the BDI amplifier 206. The BDI amplifier 206 amplifies the signal from the photodetector 102. Initially, the impedance of the BDI transistor 208 is high enough that almost all signal charges drift to the input terminal 212 of the BDI amplifier 206 since the input impedance at input terminal 212 is lower than that in BDI transistor 208. These accumulated signals at the BDI amplifier 206 tend to exit the BDI amplifier 206 towards node 217 through the high frequency path 204. Low frequency signals will be passed through BDI transistor 208 as the bandwidth of the feedback circuit is sufficient to adjust the impedance of the BDI transistor 208 in response to low frequency signal changes.

In effect, this allows high frequency signals to immediately follow to node 217 through the high frequency path 204, while the low frequency signals are diverted through the BDI transistor 208. As a result, high frequency signals that correspond to high frequency laser pulses that have short durations on the order of nanoseconds (e.g., 1-10 nsec/pulse) and tens of nanoseconds will quickly propagate to the node 217.

As time elapses, all charge signals from the photodetector 102, including low frequency and high frequency signals, can pass through the BDI transistor 208 via a charge signal path that traverses node 211, entering the BDI transistor's 208 source node and exiting the BDI transistor's 208 drain node through the low frequency path 202 to node 215 for processing by the passive imaging circuit 104. This allows the low frequency imaging signals that are captured at a slower rate (e.g., 30 msec per frame) to exit the BDI transistor 208 and enter the passive imaging circuit 104. The BDI amplifier 206 is an intrinsic low-pass filter. BDI amplifier 206 can be an amplifier that includes NMOS or PMOS transistors and has an output RC, wherein R is defined by output resistance of the BDI amplifier 206, and C is defined by the summation of either physical or parasitic capacitances at the output node of BDI amplifier 206.

The output of the BDI amplifier 206 that propagates towards the gate of the BDI transistor 208 trends over time to include lower frequency signals that bias the BDI transistor 208 to pass primarily low frequency signals from the charge that enters the BDI transistor 208 from the output of the photodetector 102, leaving high frequency signals from the charge to accumulate at the input terminal 212 of the BDI amplifier 206. High frequency signal current is blocked by impedance of the BDI transistor 208 and integrates at input of the photodetector 102 to become a voltage delta at the input terminal 212 of the BDI amplifier 206, which results in the presence of an amplified high frequency signal at the output of the BDI amplifier 206. The integrated charge from the high frequency signal is conserved and will eventually pass through the BDI transistor 208 to node 215 through the low frequency path 202, but by then it has already been low-pass filtered and its high frequency content is lost.

The BDI transistor 208 can include a direct injection transistor that receives the charge signal from the photodetector 102. In the example embodiment shown, the direct injection transistor is a p-type MOSFET otherwise referred to as a PMOS transistor. The BDI transistor 208 receives the charge from the photodetector 102 at its source node. The charge can only flow through the BDI transistor 208 and exit from its gate node to continue through the low frequency path 202 when the BDI transistor 208 is biased sufficiently by the output of BDI amplifier 206 propagating toward the gate of the BDI transistor 208.

At the beginning of signal incidence, the BDI transistor 208 is kept at high input impedance, allowing time for high frequency signals to appear at node 217. After the high frequency signals appear at node 217, BDI transistor 208 is accordingly biased sufficiently from the varying signal flowing to the high frequency path 204, allowing incident signals to exit to the low frequency path 202 as time elapses.

In the low frequency path 202, the flash ADC 110 outputs the coarse digitized signal as coarse signal digits $X_0$, $X_1$ . . . $X_n$, which can be in the form of a code, such as thermometer code or an encoded binary code. The encoded binary code can be encoded from a thermometer code generated internally within the flash ADC 110.

With reference to the high frequency path 204, the active imaging circuit 221 is configured to detect relatively high frequency pulse signals included in the photodetector output and output a corresponding binary pulse detection data. The pulse signals can be high frequency events generated by a laser or other emitters of high frequency pulse energy with short pulse durations. The laser can operate, for example in the SWIR wavelength, but is not limited to a particular wavelength. The low frequency path 202 and the high frequency path 204 can share components, such as the BDI amplifier 206 and the BDI transistor 208, however, in embodiments, the low frequency path 202 and the high frequency path 204 can be configured to be independent of one another.

The active imaging circuit 221 includes a filter 220, a comparator 230, and an output buffer 240. The filter 220 is tuned to pass high frequency components of the signal received at node 217 that propagated from the BDI amplifier 206, and attenuate noise with lower frequency content from this signal. Filter 220 thus increases the signal-to-noise ratio and the sensitivity of the pixel 100 to high frequency inputs. The filter 220 can be a highpass filter or a bandpass filter that allows only high frequency signals received via node 217 to be passed to the comparator 230. Since the BDI amplifier 206 functions as an intrinsic lowpass filter, when the filter 220 is embodied as a highpass filter, the combination of the BDI amplifier 206 and the filter 220 form a bandpass filter.

The filter 220 can be, for example, an RC filter having a capacitor 222 (labeled $C_{HF}$) coupled to a fixed resistor 224 (labeled $R_{HW}$) and one or more configurable resistors 226 (labeled $R_0$, $R_1$ . . . $R_N$), with each of resistors 226 being coupled to a corresponding first switch 228 of a first set of switches. The capacitor 222 can be, for example, a metal-insulator-metal (MIM), polysilicon-to-polysilicon, metal-polysilicon, or transistor-based device. The resistors 224 and 226 can be, for example, metal based, diffusion based, polysilicon based, or transistor based. There are 1–N+1 configurable resistors 226, wherein each of the configurable resistors can be enabled or disabled by its corresponding switch 228. The fixed resistor 224 and the configurable resistors 226 are coupled in parallel to a conductor coupled between the capacitor 222 and the comparator 230. The output from the highpass filter 220 is provided as an input voltage to the comparator 230.

Accordingly, operation of first switches 228 for enabling or disabling individual, configurable resistors 226 adjusts a frequency response of the highpass filter formed by $C_{HF}$ and $R_{HF}$. Each of first switches 228 is operated (opened or closed) by a respective coarse signal digit. Consequentially, the coarse signal digits adjust the frequency response of the highpass filter 220.

The comparator 230 is a high frequency comparator that can compare signals provided as an input voltage at a high frequency rate, outputting a HIGH or LOW signal ($V_{COMP}$) to the output buffer to indicate the outcome of the comparison. For example, the comparator can include a difference amplifier. The comparator 230 receives a threshold voltage ($V_{THRESHOLD}$) and compares the input voltage it receives, which is the output of the highpass filter 220, to the threshold voltage. This switching point or threshold is adjusted by a fixed current sink device 234 (labeled ($I_B$) and one or more configurable current sink devices 236 (labeled $I_{B\_X0}$, $I_{B\_X1}$ ... $I_{B\_XN}$), with each of the configurable current sink device 236 being controlled by a respective coarse signal digit X0, X1 ... XN. Therefore, although a global threshold ($V_{THRESHOLD}$) is provided, current sink devices $I_B$ 234 and $I_{B\_X0}$, $I_{B\_X1}$ ... $I_{B\_XN}$ 236 provide an additional threshold adjustment knob. Moreover, the comparator gain is also a function of bias current and will be affected by current sink devices $I_B$ 234 and $I_{B\_X0}$, $I_{B\_X1}$ ... $I_{B\_XN}$ 236. Therefore, the overall sensitivity of the comparator can be adjusted by current sink devices $I_B$ 234 and $I_{B\_X0}$, $I_{B\_X1}$ ... $I_{B\_XN}$ 236. There are 1-N+1 configurable current sink devices 236, wherein each of the configurable current sink devices 236 can be enabled or disabled by its corresponding coarse signal digit. For example, each of the configurable current sink devices 236 can be a transistor that functions as a switch and can be enabled or disabled by its corresponding coarse signal digit.

In the example shown, the current sink devices are connected in parallel to a single node that is coupled to a component of the comparator that controls its frequency threshold, however the disclosure is not limited to the particular configuration shown. The fixed and configurable current sink devices 234 and 236 can be configured instead as current source devices, depending on an implementation used for the comparator 230. The fixed and configurable current sink devices 234 and 236 can be implemented, for example, using a transistor, such as an NMOS transistor. For example, a source of the transistor can be coupled to ground, a drain of the transistor can be coupled to an output terminal of the comparator 230, and the coarse signal digits can be coupled to a gate of the transistor.

In the example shown, the output buffer 240 is a one bit memory, such as a transistor, that receives a binary (HIGH or LOW) response from the comparator 230 and stores it until the value stored is readout to the column 112.

With reference to FIG. 3, an exemplary imaging device 300 is provided that includes an FPA 302. The FPA 302 includes an example array of pixels 304, each pixel shown as pixel 100. Each pixel 100 receives an input signal from a corresponding photodetector. A column conductor 112 traverses a column of pixels 100 in the array 304, coupling to the pixels that it traverses.

An external ADC 306 which can be co-located on the same die as the pixel array receives an analog imaging signal from column buffer 108 via one or more column conductors 112 and converts the analog imaging signal into a digital imaging signal. The external ADC 306 can optionally include a coarse digitized signal handler 308. Optionally, the external ADC 306 can receive the corresponding coarse digitized signal from the flash ADC 110 via one or more column conductors 112. The external ADC 306 can either use or discard the coarse digitized signal. If using the coarse digitized signal, the coarse digitized signal handler 308 combines digitized imaging signal with the coarse digitized signal inserting the MSBs of the coarse digitized signal into a higher bit portion (the MSBs) of the digitized imaging signal. The combined signal represents a complete digital imaging signal that uses the coarse digitized signal. Since the coarse digitized signal was digitized closer to the actual source of the analog imaging signal, it is less prone to noise and distortion relative the analog imaging signal received by the external ADC via the column conductor 112, which can improve the quality of the complete digital imaging signal.

Alternatively, in order to improve accuracy of the analog to conversion process by using redundancy, coarse digitized signal handler 308 processes the MSBs of the digital imaging signal and the MSBs of the coarse digitized signal. The processing of the two sets of MSBs can include averaging, weighting, replacing, etc. The processed value can be combined with the digital imaging signal by replacing the MSBs, resulting in a complete digital imaging signal that is improved by the coarse digitized signal.

The pixels 100 included in the FPA can include multimode pixels that include a passive imaging circuit and an active imaging circuit, such as the embodiment shown in FIG. 2, and/or passive imaging pixels that include a passive imaging circuit but do not include an active imaging circuit, such as the embodiment shown in FIG. 1. The FPA can be used in applications such as a SWIR, MWIR, or LWIR cameras, such as for detecting laser pulses emitted by military laser designators and reflected from targets, or other applications for cameras that passively acquire images and optionally detect short duration, high frequency light impulses. By providing the flash ADC within the array of pixels 304 to perform digital conversion of the MSBs of the analog imaging signal within in the pixel array, the component footprint for size, weight and/or power consumption (SWaP) outside of pixel array can be reduced, and/or the coarse digitized signal can be used for redundancy purposes to improve accuracy of the analog to digital conversion process.

The FPA can use a CMOS technology that accesses a plurality of interconnect layers and/or uses through-silicon vias (TSVs) that provide a vertical electrical connection (via) that can pass completely through a silicon wafer or die to create a 3D integrated circuits where all or a portion of the flash ADC 110 can be positioned on different interconnect layers and signals are conveyed between layers using TSV and/or interconnects formed using a bumping technology.

Figure 4:
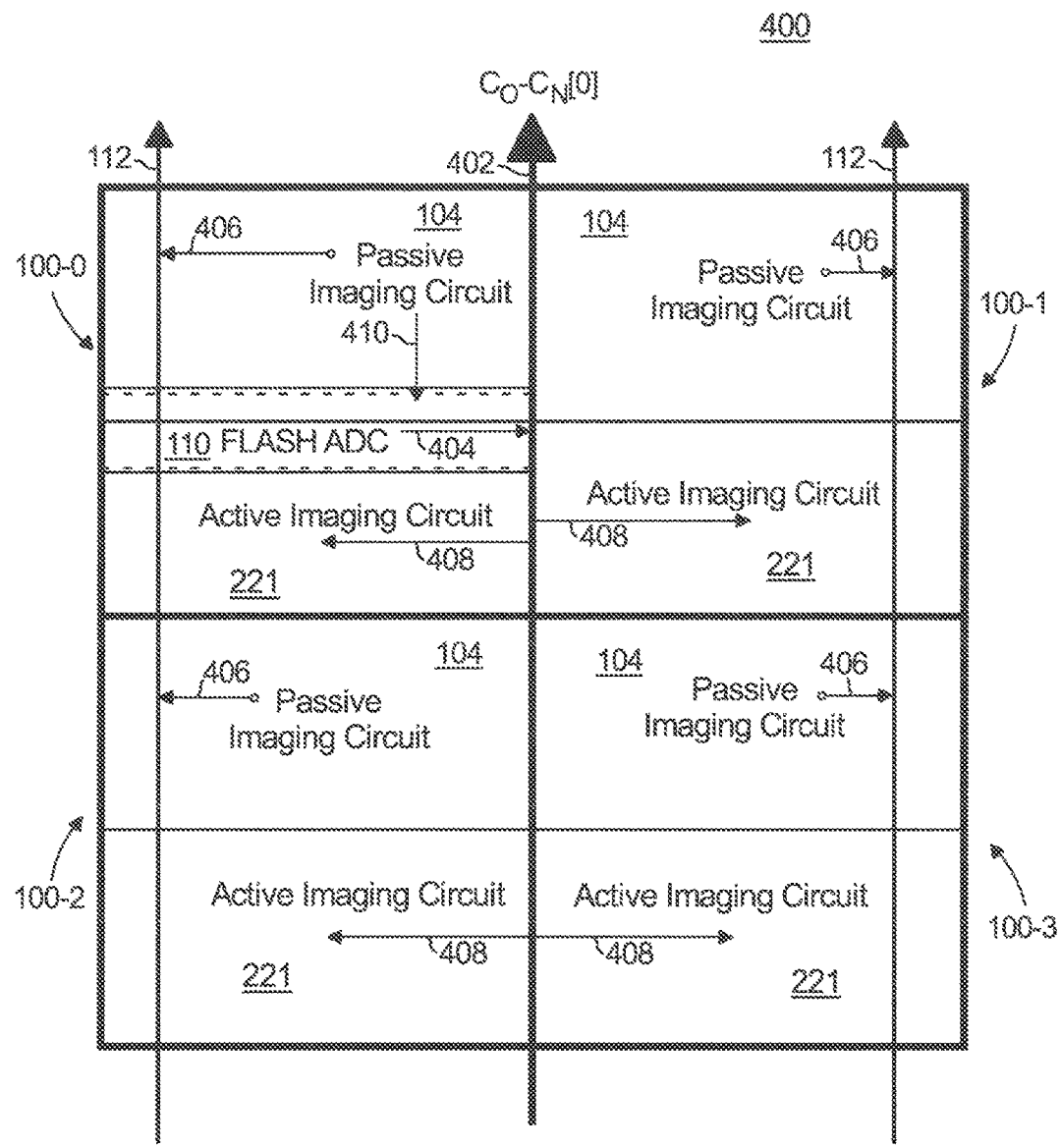
FIG. 4 is a conceptual diagram of an embodiment of an exemplary subarray of pixels having a flash ADC for the subarray in accordance with embodiments of the present disclosure.
Figure 5:
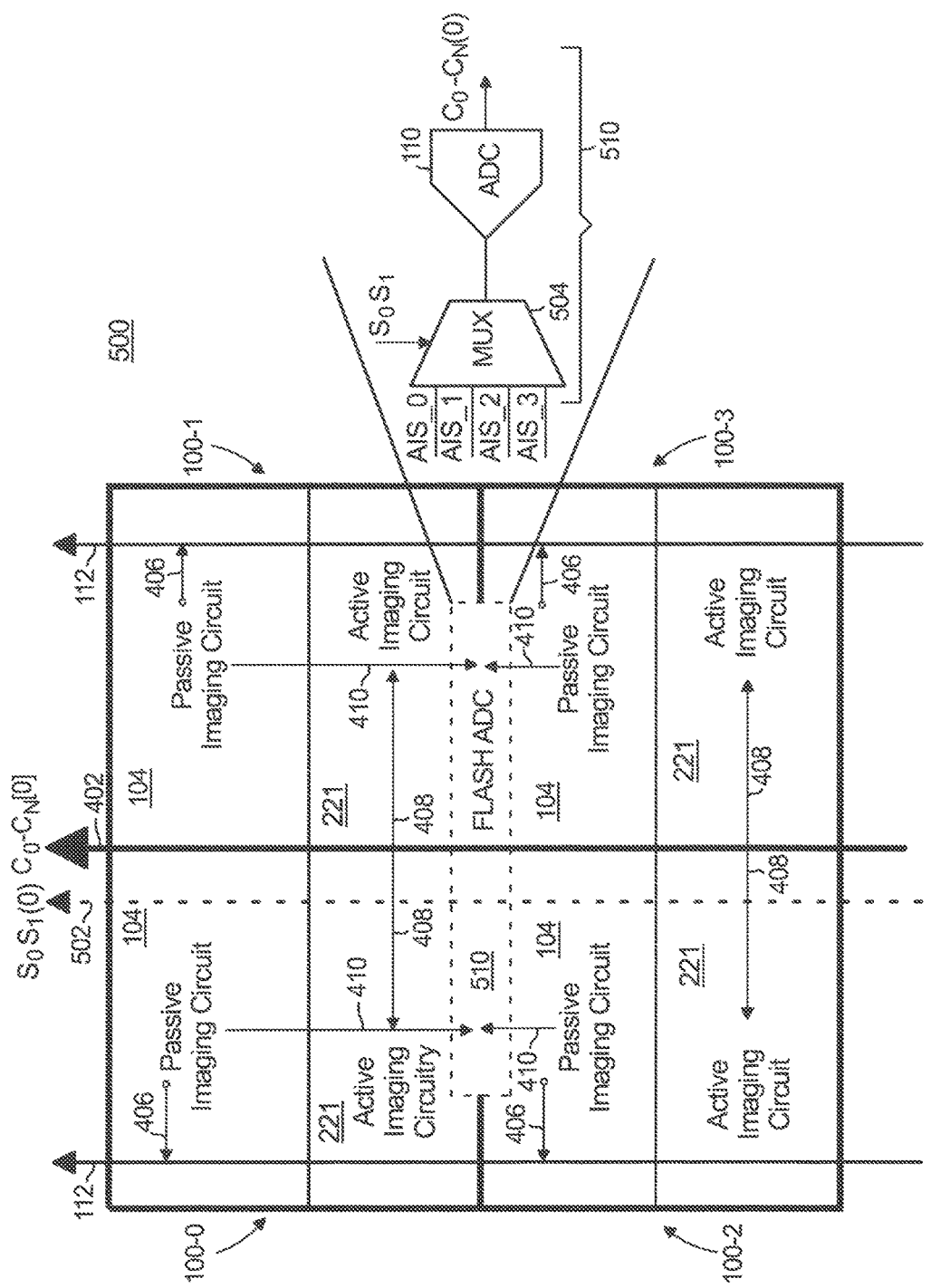
FIG. 5 is a conceptual diagram of another embodiment of an exemplary subarray of pixels having a flash ADC for the subarray in accordance with embodiments of the present disclosure.

FIGS. 4 and 5 show embodiments of exemplary subarrays of a pixel array, such as pixel array 304 shown in FIG. 3 in which a flash ADC is provided that corresponds to a subarray and is internal to the pixel array. The flash ADC outputs the coarse digitized signal both internally within the pixel array and externally to the external ADC.

FIG. 4 shows an exemplary embodiment in which a single flash ADC 110 is provided for a subarray 400 of pixels 100, shown as 100-0, 100-1, 100-2, and 100-3. A coarse bit bus 402 is provided that receives the coarse digitized signal output by the flash ADC 110 via a coarse bit input conductor 404. The active imaging circuit 221 can optionally receive the coarse digitized signal from the coarse bit bus 402 via a coarse bit output conductor 408, which enables configuring of the configurable resistors 226 and configurable current sinks 236 to adjust sensitivity of the active imaging circuit 221. In this embodiment, output from the passive imaging circuits 104 of only one pixel 100-0 of the pixel array 400, is connected to the flash ADC 110 by an ADC input conductor 410. Column input conductors 406 are shown that provide the analog imaging signal from passive imaging circuit 104 to the column conductor 112.

The subarray 400 in the example shown in FIG. 4 is a 2×2 array, however the disclosure is not limited to a particular size subarray. In certain applications, there may be insignificant variance in light flux across a relatively small subarray, such as a 2×2 subarray, such that the advantage of adjusting sensitivity of the active imaging circuit 221 using output form the flash ADC 110 can still be gained while using less components, namely fewer ADCs 110. In embodiments, the coarse bit bus 402 can further provide the coarse digitized signal to the coarse digitized signal handler 308 of the external ADC 306 shown in FIG. 3.

FIG. 5 shows another exemplary embodiment in which a single flash ADC 510 is provided for a subarray 500 of pixels 100. In this embodiment, each pixel 100-0 through 100-3 provides active imaging signals to the flash ADC 510 via an ADC input conductor 410. A selection bus 502 is provided that provides selection signals S1, S2 to the flash ADC 510. The flash ADC 510 includes a multiplexor (MUX) 504 and a flash ADC 110. The MUX 504 receives the analog imaging signals AIS_0-AIS_3 from each of the respective pixels 100-0 through 100-3, selects which analog imaging signal to use based on the selection signals S1, S2, and provides the selected analog imaging signal as input to flash ADC 110. The embodiment in FIG. 5 requires additional components relative to the embodiment in FIG. 4, namely an ADC input conductor 410 for each pixel 100 in the subarray 500, the selection bus 502, logic for generating signals S1, S2 (not shown) and the MUX 510, however, this embodiments allows coarse digitized signals to be used for each pixel 100 in the subarray 500.

The embodiments shown in FIGS. 4 and 5 of applying the flash ADC 110 to a subarray of pixels are exemplary. The disclosure is not limited to a particular size subarray of pixels, to the number of pixels of the subarray that provide analog passive imaging signals to the flash ADC, or to a particular configuration for distributing the coarse digitized signals or the selection signals to the pixels of the subarray.

Figure 6:
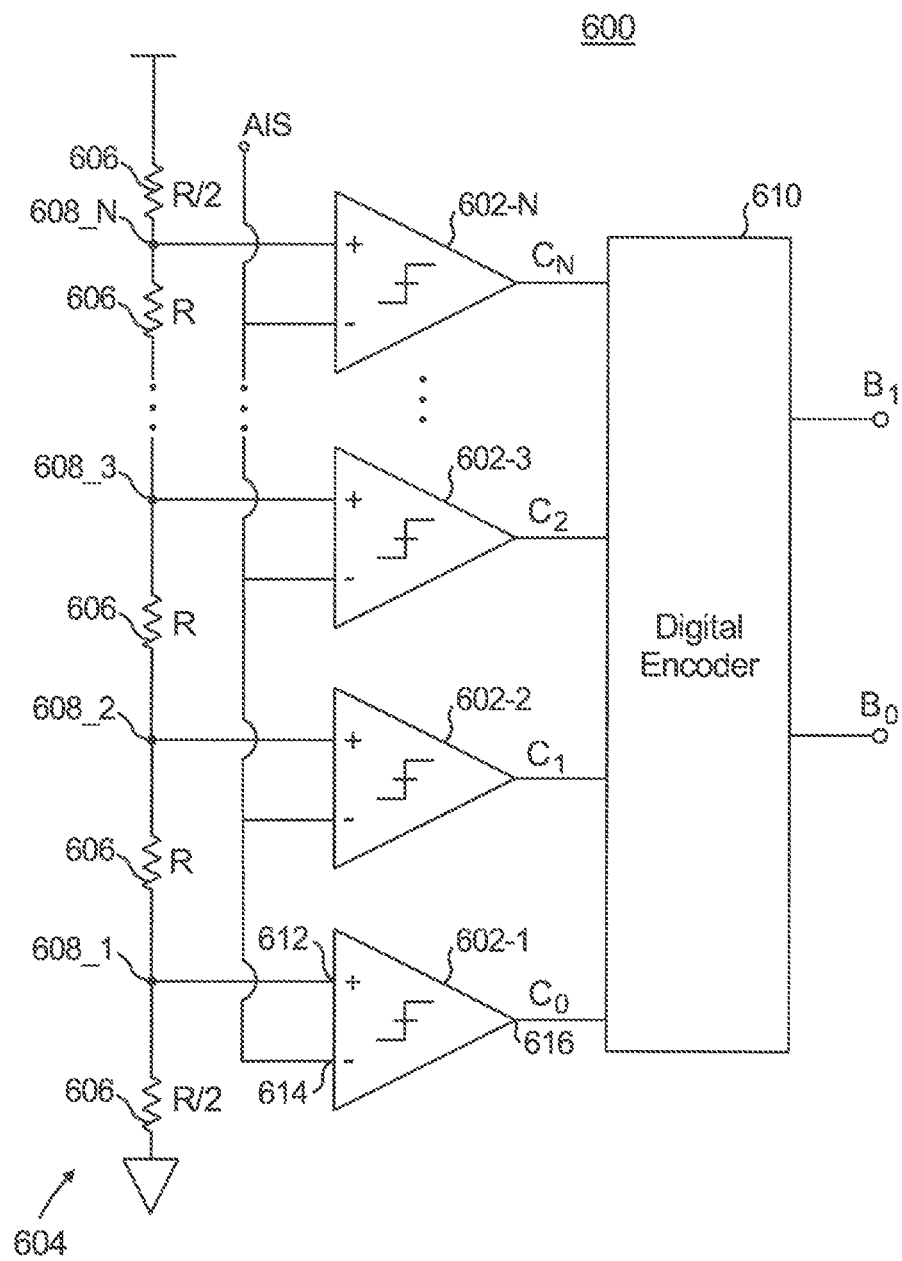
FIG. 6 is a schematic diagram of an exemplary flash ADC that includes a resistor string in accordance with embodiments of the present disclosure.

With reference to FIG. 6 an example embodiment of a flash ADC 600 is shown. Flash ADC 110 shown in FIG. 1 can be embodied as flash ADC 600. The flash ADC 600 includes N comparators 602_1-602_N (for N≥2), referred to generally as 602. ADC 600 further includes a resistor string 604. The resistor chain 604 includes at least one resistor 606 coupled to a second reference voltage Vref2 and N nodes 608_1-608_N (for N≥2), referred to generally as 608. When there are two or more resistors 606, the resistors are coupled in series to the second reference voltage. Each of the nodes 608 is positioned at a different location relative to the resistors 606, such as between different resistors 606, so that each node 608 has a unique voltage relative to the other nodes 608. In the example shown, the nodes 608_1-608_N are consecutively positioned along the resistor string 604, with the resistors 608 positioned between each of the consecutive nodes 608 provides the same impedance, such that the impedance increases linearly at each consecutive node 608_1-608_N.

Each comparator 602 has a reference terminal 612, an input terminal 614 and an output terminal 616. The comparator 602 determines whether a difference between voltages received at the reference terminal 612 and the input terminal 614 exceeds a predetermined threshold, and outputs from the output terminal 616 an output voltage $C_i$ as that is set to a HIGH or LOW voltage (also referred to as "1" or "0") based on a result of the determination.

In the example shown, each comparator receives a voltage signal at its reference terminal 612 from the node 608 with which it is associated, and receives the passage imaging signal at its input terminal 614. The comparator 602 outputs a voltage output $C_i$ from its output terminal 616.

In the example shown, each comparator 602_i outputs a voltage output $C_i$, for i=0-N. The voltage outputs $C_0, C_1, C_2, C_3$ can form a code, such as a thermometer code. In embodiments, the code $C_0 \ldots, C_N$ can be output as the coarse digitized signal from the flash ADC 600, such as to the column conductor 112 or to the active imaging circuit 221 for adjusting sensitivity of the active imaging circuit 221. In embodiments, the code $C_0 \ldots, C_N$ can be input to a digital encoder 610, which encodes the code $C_0 \ldots, C_N$ into a binary code, shown in the current example as $B_0B_1$. The disclosure does not limit the number of digits in the code output by the comparators 602, $C_0 \ldots, C_N$, or in the binary code $B_0B_1$ output as the coarse digitized signal by the encoder 610 to a particular number of digits. In embodiments, the code $B_0B_1$ can be output from the flash ADC 600, such as to the column conductor 112 or to the active imaging circuit 221 for adjusting sensitivity of the active imaging circuit 221.

Figure 7A:
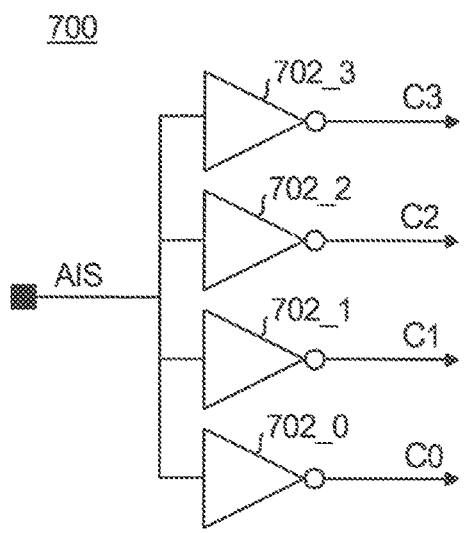
FIG. 7A is a schematic diagram of an exemplary flash ADC that includes a plurality of inverters in accordance with embodiments of the present disclosure.

With reference to FIG. 7A, a schematic diagram of an example embodiment of a flash ADC 700 is shown. Flash ADC 110 shown in FIG. 1 can be embodied as flash ADC 700. The flash ADC 700 includes N inverters $702\_1$-$702\_N$ (for N≥2), referred to generally as 702. The passive imaging signal is input to each of the inverters 702. Each of the inverters 702 is configured to operate in accordance with a unique voltage transfer curve (VTC) relative to the other inverters 702. The unique VTC defines a threshold voltage (also referred to as switching point) for that inverter 702 so that each inverter 702i has a unique threshold voltage and operates differently on the analog imaging signal for outputting a voltage output $C_i$ as HIGH or LOW. In the example shown, each inverter 702_i outputs a voltage output Ci, for i=0-N. The voltage outputs C0, C1, C2, C3 can form a code, such as a thermometer code.

The VTC and threshold voltage of each inverter 702_i can be determined by a characteristic of the inverters 702. In the example shown, each inverter 702_i has a different overall dimension characteristic that causes each inverter 702_i to have a unique VTC and threshold voltage. The disclosure is not limited to a particular characteristic or dimension characteristic for causing each inverter 702_i to have the unique VTC and threshold voltage. In the example shown, the overall dimension characteristic that is unique for each inverter 700_i is the ratio DCP/DCN, wherein DCP is a dimension characteristic defined by at least one dimension of a PMOS transistor of the inverter 700_i and DCN is the dimension characteristic of an NMOS transistor of the inverter 700_i. The ratio DCP/DCN of each inverter 702 influences the VTC associated with that inverter 702.

Figure 7B:
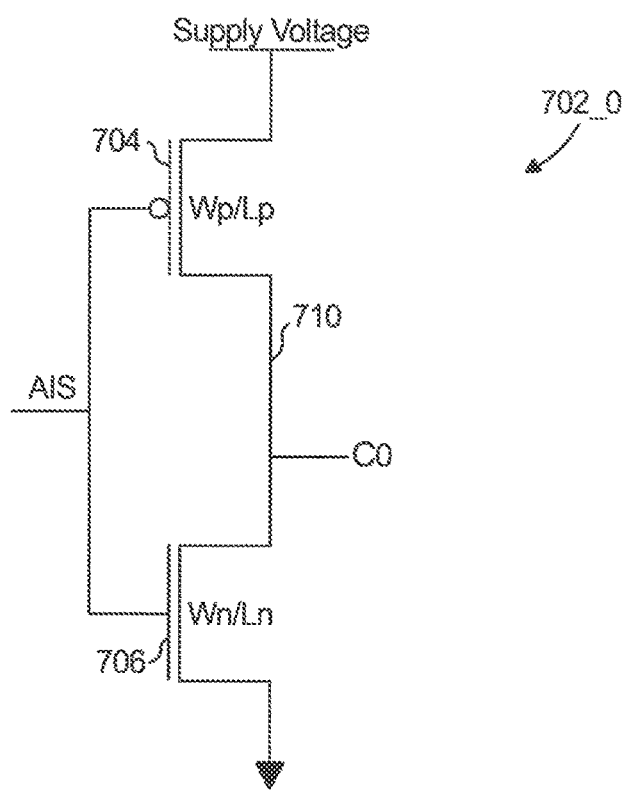
FIGS. 7B and 7C are schematic diagrams of exemplary inverters of the flash ADC shown in FIG. 7A.
Figure 7C:
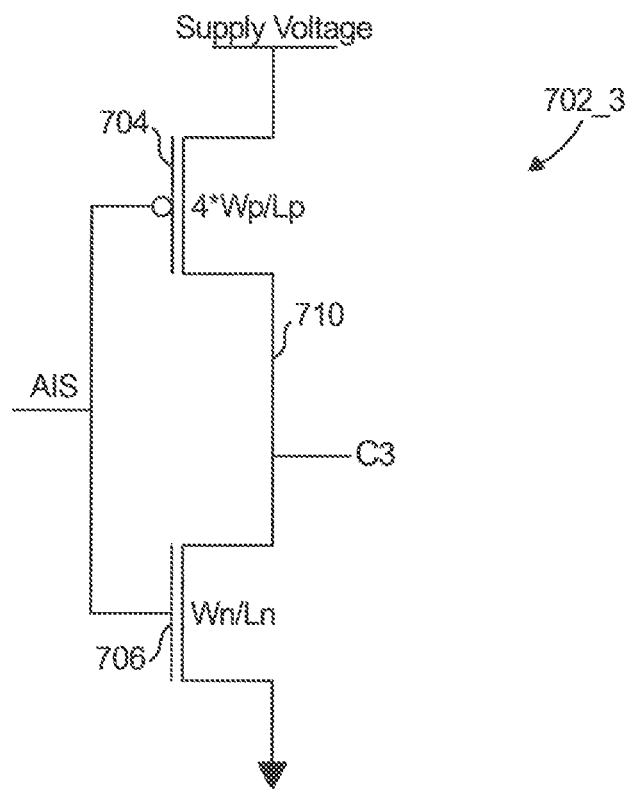

With reference to FIGS. 7B and 7C, a detailed schematic view of example inverters 702_0 and 702_3 are shown, respectively. Inverters 702_1 and 702_2 can be configured with the same components. However, each inverter 702_1-702_3 has different dimensions, wherein the dimensions affect the inverter's minimum threshold voltage. In the example shown, each inverter 702 includes a PMOS transistor 704 and an NMOS transistor 706. A source terminal of the PMOS transistor 704 is connected to a supply voltage. A drain of the PMOS transistor is connected to a drain terminal of the NMOS transistor 706. An output $C_i$ is output via output line 710, which is connected to the drain terminals of both the PMOS transistor 704 and the NMOS transistor 702. A source terminal of the NMOS transistor 706 is connected to ground. The input analog imaging signal is input to gate terminals of both the PMOS transistor 704 and the NMOS transistor 706.

With reference to FIGS. 7A-7C, in the example shown, the dimensions DCP of inverter 702_0 are Wp/Lp, where Wp is the width and Lp is the length of the PMOS transistor 704. The dimensions DCN of inverter 702_0 are Wn/Ln, where Wn is the width and Ln is the length of the NMOS transistor 706. The lengths Lp and Ln for all of the inverters 702_0-702_3 are both set to the same value. In this particular example, the lengths Lp and Ln are set to the minimum allowable by the design rules (Lp=Ln). Accordingly, DCP/DCN for inverter 702_0=Wp/Wn.

The threshold voltages of the subsequent inverters 702_1-702_3 are sequentially increased by decreasing the effective resistance of the PMOS transistor 704 relative to the NMOS transistor 706. This effective resistance can be decreased, for example, by either (1) increasing the width the PMOS transistor 704 relative to the NMOS transistor 706 or (2) decreasing the width of the NMOS transistor 706 relative to the PMOS transistor 704. The present example is configured in accordance with choice (1), in which the PMOS transistor 704 of inverter 702_3 has a width 4*Wp. Since Lp=Ln, DCP/DCN for inverter 702_3=4*Wp/Wn, which is 4× that the DCP/DCN for inverter 702_0, which=Wp/Wn.

The PMOS transistor 704 of inverter 702_2 has a width 3*Wp and the PMOS transistor 704 of inverter 702_1 has a width 2*Wp. Accordingly, DCP/DCN for inverters 702_0-702_3 is, respectively, Wp/Wn, 2*Wp/Wn, 3*Wp/Wn, and 4*Wp/Wn.

Figure 7D:
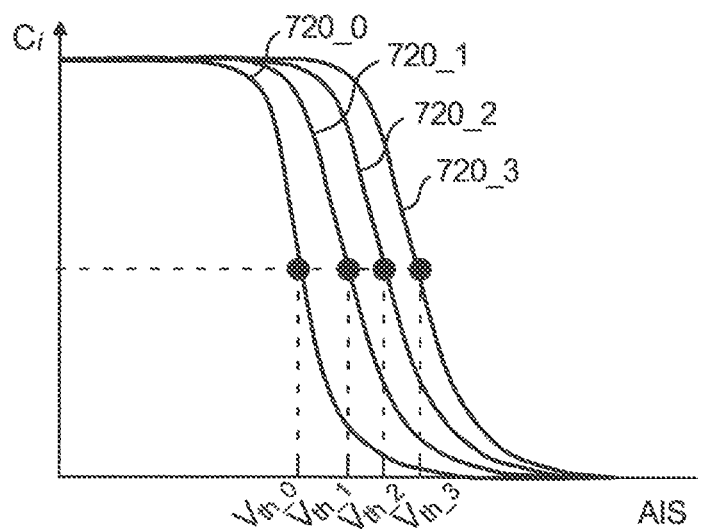
FIG. 7D is a plot of voltage transfer curves associated with individual inverters of the flash ADC shown in FIG. 7A.

With reference to FIG. 7D, example VTC curves 720_i are shown that that correspond to inverters 702_i and have corresponding voltage thresholds Vth_i, for i=0-3 are shown. In the example shown, just as the DCP/DCN for inverters 702i increases from lowest to highest for i=0-3, Vth_i increases from lowest go highest for i=0-3.

In embodiments, the voltage outputs $C_0$, $C_1$, $C_2$, $C_3$ can form a code, such as a thermometer code. In embodiments, the code $C_0 \ldots, C_N$ can be output as the coarse digitized signal from the flash ADC 700, such as to the column conductor 112 or to the active imaging circuit 221 for adjusting sensitivity of the active imaging circuit 221. In embodiments, the code $C_0 \ldots, C_N$ can be input to a digital encoder (such as the digital encoder 610 shown in FIG. 6), which encodes the code $C_0 \ldots, C_N$ into a binary code, shown in the current example as $B_0B_1$. The disclosure does not limit the number of digits in the code output by the inverters 702, $C_0 \ldots, C_N$, or in the binary code $B_0B_1$ output as the coarse digitized signal by the encoder 610 to a particular number of digits. In embodiments, the code $B_0B_1$ can be output from the flash ADC 700, such as to the column conductor 112 or to the active imaging circuit 221 for adjusting sensitivity of the active imaging circuit 221.

The methods and systems of the present disclosure, as described above and shown in the drawings, provide for performing a coarse analog to digital conversion of the analog imaging signal using a plurality of flash ADCs within the pixel array, thus reducing the SWaP footprint of ADC components external to the array and/or using output of the coarse ADC conversion performed in the signal array for redundancy purposes to improve accuracy of the conversion process. Additionally or alternatively, the output of the coarse ADC can be used to adjust sensitivity of active image processing by an active image circuit. The flash ADCs can be constructed using TSV technology and/or bumping technology for providing interconnects between different interconnect layers.

While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A pixel of a pixel array comprising:
   a low frequency path configured to receive an input signal from a corresponding photodetector, the low frequency path comprising:
   a passive imaging circuit provided along the low frequency path, the passive imaging circuit configured to output an analog imaging signal; and
   a flash analog to digital converter (ADC) that receives the analog imaging signal and process the analog imaging signal to output a coarse digitized signal, wherein the analog imaging signal and the coarse digitized signal are both provided to a column conductor of the pixel array for being propagated outside of the pixel array.

2. A pixel of a pixel array comprising:
   a low frequency path configured to receive an input signal from a corresponding photodetector, the low frequency path comprising:
   a passive imaging circuit provided along the low frequency path, the passive imaging circuit configured to output an analog imaging signal;
   a flash analog to digital converter (ADC) that receives the analog imaging signal and process the analog imaging signal to output a coarse digitized signal; and
   a high frequency path configured to receive an input signal from a corresponding photodetector, the high frequency path comprising:
   an active imaging circuit configured to receive the coarse digitization signal as a sensitivity input that adjusts sensitivity of the active imaging circuit for sensing laser pulses and outputting a pulse signal that indicates whether a pulse was detected.

3. The pixel of claim 2, wherein the analog imaging signal and the coarse digitized signal are both provided to a column conductor of the pixel array for being propagated outside of the pixel array.

4. The pixel of claim 2, wherein the active imaging circuit includes a high-pass filter, and the sensitivity input adjusts a frequency response of the high-pass filter.

5. The pixel of claim 4, wherein the high-pass filter includes an RC filter that includes a plurality of resistive devices and at least one capacitive device, a resistive device of the plurality resistive devices being coupled to the RC filter, and additional resistive devices of the plurality of resistive devices are selectively coupled to the RC filter based on the sensitivity input, and each of the resistive devices that is coupled to the RC filter influences the frequency response of the RC filter.

6. The pixel of claim 2, wherein the active imaging circuit further includes a comparator coupled to a frequency response device of a plurality of frequency response devices, additional frequency response devices of the plurality of frequency response devices are selectively coupled to the comparator based on the sensitivity input, and each of the plurality of frequency response devices coupled to the comparator influences the frequency response of the comparator.

7. The pixel of claim 2, wherein the active imaging circuit further includes a comparator coupled to a threshold adjustment device of a plurality of threshold adjustment devices, additional threshold adjustment devices of the plurality of threshold adjustment devices are selectively coupled to the comparator based on the sensitivity input, and each of the plurality of threshold adjustment devices coupled to the comparator influences the switching point of the comparator.

8. The pixel of claim 6, wherein the at least one selected frequency response device is coupled to a single node, and the single node is coupled to the comparator.

9. The pixel of claim 2, wherein the active imaging circuit further includes a buffer to store the output from the comparator, wherein the buffer is provided to a column of a readout circuit of the pixel array.

10. A pixel of a pixel array comprising:
a low frequency path configured to receive an input signal from a corresponding photodetector, the low frequency path comprising:
a passive imaging circuit provided along the low frequency path, the passive imaging circuit configured to output an analog imaging signal; and
a flash analog to digital converter (ADC) that receives the analog imaging signal and process the analog imaging signal to output a coarse digitized signal, wherein the flash ADC includes a plurality of components of one common type, each of the components operating differently on the analog imaging signal relative to the other components, each of the components configured to output a component signal, the component signal being indicative of the associated component's operation on the analog imaging signal, the component signals output by the plurality of components being at least one of the coarse digitized signal or being encoded into the coarse digitized signal.

11. The pixel of claim 10, wherein the components are inverters, each inverter having a unique voltage transfer curve (VTC) that defines a threshold voltage that causes the inverter to operate differently on the analog imaging signal than the other inverters and output and associated component signal as a HIGH or a LOW value.

12. The pixel of claim 10, wherein each of the inverters includes a PMOS transistor having a first dimension characteristic DCP and an NMOS transistor having a second dimension characteristic DCN, wherein each of the first and second dimension characteristics are defined by at least one dimension of the corresponding NMOS or PMOS transistor, a unique ratio DCP/DCN being associated with each inverter, the ratio DCP/DCN associated with each transistor influencing the VTC associated with the inverter.

13. The pixel of claim 10, wherein each component of the plurality of components is a comparator associated with a unique node of multiple nodes of a resistor chain, the resistor chain including a plurality of resistors coupled in series to a reference voltage, wherein each of the nodes of the resistor chain is positioned between different resistors of the resistor chain and has a unique voltage relative to the other nodes, each comparator configured to receive the analog imaging signal as an input voltage, and further being coupled to its associated node to receive a reference input voltage, wherein a signal output by the comparator is the corresponding component signal.

14. The pixel of claim 10, wherein the components are configured so that the component signals are provided as a thermometer code.

15. The pixel of claim 10, wherein the pixel further comprises an encoder, wherein the encoder encodes the component signals output by the plurality of components and outputs the coarse digitized signal.

16. A focal plane array (FPA) the FPA comprising:
an array of pixels, each pixel of the array including a low frequency path configured to receive an input signal from a corresponding photodetector, the low frequency path including a passive imaging circuit that outputs an analog imaging signal;

a plurality of flash analog to digital converters (ADCs), each flash ADC corresponding to a different individual pixel of the array of pixels or a different subarray of pixels of one or more subarrays of the pixel array, the flash ADC configured to receive the analog imaging signal output by the pixel of the subarray of pixels to which it corresponds, and processing the analog imaging signal to output a coarse digitized signal;
a column conductor coupled to the passive imaging circuits and the flash ADCs of the pixel array for receiving the analog imaging signal and the coarse digitized signal; and
an external ADC coupled to a portion of the column conductor that is external to the array of pixels, wherein the external ADC converts the analog imaging signal into a fine component and outputs a full digitized signal that includes the coarse component and the fine component.

17. The FPA of claim 16, wherein the external ADC a fine component using the analog imaging signal and output a full digitized signal that uses the fine component, and further applies redundancy processing to the coarse digitized component for incorporating the coarse digitized signal into the full digitized signal.

18. A focal plane array (FPA) the FPA comprising:
an array of pixels, each pixel of the array including a low frequency path configured to receive an input signal from a corresponding photodetector, the low frequency path including a passive imaging circuit that outputs an analog imaging signal; and
a plurality of flash analog to digital converters (ADCs), each flash ADC corresponding to a different individual pixel of the array of pixels or a different subarray of pixels of one or more subarrays of the pixel array, the flash ADC configured to receive the analog imaging signal output by the pixel of the subarray of pixels to which it corresponds, and processing the analog imaging signal to output a coarse digitized signal, wherein a subarray of the at least one subarrays includes a subset of pixels of the array of pixels and a digital coarse bus connected to the flash ADC that corresponds to the subarray, wherein the digital coarse bus is configured to receive a coarse digitized signal output by the flash ADC and to provide the coarse digitized signal received to an active imaging circuit in each of the subset of pixels of the subarray as a sensitivity input for adjusting the sensitivity of each of the active imaging circuits of the respective pixels of the subset of pixels.

19. The FPA of claim 18, wherein the subarray includes a conductor for coupling a passive imaging circuit of at least two pixels of the subset of pixels of the subarray to the flash ADC to provide analog imaging signals to the flash ADC, and a pixel of the at least two pixels is selected to provide the analog imaging signals output by its passive imaging circuit to the flash ADC to be processed for outputting the coarse digitized signal.

20. A method comprising:
receiving an input signal in a pixel from a corresponding photodetector;
processing, in the pixel, low frequency components of the input signal using passive imaging processing to generate an analog imaging signal;
converting, in the pixel, the analog imaging signal into a coarse digitized signal detecting, in the pixel, pulses included in high frequency components of the input signal; and adjusting sensitivity of the active imaging circuit using the coarse digitized signal.

* * * * *